United States Patent
Pasadyn et al.

(10) Patent No.: US 6,773,931 B2
(45) Date of Patent: Aug. 10, 2004

(54) DYNAMIC TARGETING FOR A PROCESS CONTROL SYSTEM

(75) Inventors: Alexander J. Pasadyn, Austin, TX (US); Thomas J. Sonderman, Austin, TX (US); Jin Wang, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 228 days.

(21) Appl. No.: 10/207,525

(22) Filed: Jul. 29, 2002

(65) Prior Publication Data

US 2004/0029299 A1 Feb. 12, 2004

(51) Int. Cl.[7] .............................................. H01L 21/00
(52) U.S. Cl. ........................................ 438/10; 700/121
(58) Field of Search .............................. 438/5, 10, 11, 438/14, 17, 18; 700/121

(56) References Cited

U.S. PATENT DOCUMENTS 5,270,222 A * 12/1993 Moslehi ........................ 438/7
6,408,220 B1 * 6/2002 Nulman ...................... 700/121
6,444,481 B1 * 9/2002 Pasadyn et al. ................ 438/5
6,587,744 B1 * 7/2003 Stoddard et al. ............... 438/5

* cited by examiner

Primary Examiner—Chandra Chaudhari
(74) Attorney, Agent, or Firm—Williams, Morgan & Amerson, P.C.

(57) ABSTRACT

A method and an apparatus for dynamic targeting for a process control system. A process step is performed upon a first workpiece in a batch based upon a process target setting. The process target setting comprises at least one parameter relating to a target characteristic of the first workpiece. Manufacturing data relating to processing of the first workpiece is acquired. The manufacturing data comprises at least one of a metrology data relating to the processed first workpiece and a tool state data relating to the tool state of a processing tool. Electrical data relating to the processed first workpiece is acquired at least partially during processing of a second workpiece in the batch. The process target setting is adjusted dynamically based upon a correlation of the electrical data with the manufacturing data.

27 Claims, 10 Drawing Sheets

DYNAMIC TARGETING FOR A PROCESS CONTROL SYSTEM

BACKGROUND OF THE INVENTION

1. Field of the Invention

This invention relates generally to semiconductor manufacturing, and, more particularly, to a method and apparatus for a dynamic targeting system for dynamically adjusting a process control system.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formation of various features or objects in the process layer. Such features may be used as, for example, a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on approximately one to four die 103 locations at a time, depending on the specific photomask employed. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

The health of a processing tool (tool health) may vary during wafer-processing performed by the processing tool. The tool health may relate to an assessment of how well the processing tool operates within a predetermined specification, which may include specifications such as tool environment characteristics (e.g., tool temperature, humidity, and the like) and quality and accuracy of the process performed by the processing tool. Variations in the tool health may occur and adversely affect the quality of processed semiconductor wafers 105. Variations in the tool health may cause degradation in the operation of a processing tool. A control model that is implemented to control the operation of the processing tool may be substantially modified to compensate for the degradation of operations of the processing tool. Eventually, the control model may become excessively modified, and as a result, the operation of the processing tool may become unpredictable and/or unreliable. In other words, the process operation may drift from a predetermined range of values. This may result in non-uniform quality and accuracy in the processed semiconductor wafers 105.

Turning now to FIG. 2, a typical flow of processes performed on a semiconductor wafer 105 by a semiconductor manufacturing system is illustrated. Generally, semiconductor wafers 105 are processed by a manufacturing system (block 210). Upon processing the semiconductor wafers 105, the manufacturing system may make a determination whether a scheduled time to acquire manufacturing data, such as metrology data, tool state data, and the like; or a triggering event (e.g., tool malfunction, etc.) that causes acquisition of manufacturing data, has occurred (block 220). When the system determines that a scheduled time or a triggering event to acquire manufacturing data has not occurred, the manufacturing system continues to process semiconductor wafers 105 (block 225).

When the manufacturing system determines that a triggering event or a scheduled time to acquire manufacturing data has occurred, acquisition of manufacturing-related data is performed (block 230). This may include acquiring metrology data related to the processed semiconductor wafers 105 and/or acquiring tool state data (e.g., pressure data, temperature data, humidity data, gas flow rate data, and the like). The manufacturing system may then perform an analysis of the acquired manufacturing related data to check for process errors, defects on the-processed semiconductor wafers 105, and the like (block 240). In response to the analysis of the manufacturing-related data, the manufacturing system may perform adjustments to subsequent process operations (block 250). Subsequently, the manufacturing system may continue processing semiconductor wafers 105 using the modified control model (block 260). Alternatively, the manufacturing system may stop processing semiconductor wafers 105 based upon the analysis of the manufacturing related data.

Among the problems associated with the current methodology include, having to wait to perform large amounts of analysis and/or computations to adjust process operations performed on the semiconductor wafers 105. Having to wait to perform these analysis and/or computations may slow down the rate at which adjustments to subsequent process operations are performed. For example, processing a large amount of manufacturing-related data to perform a run-to-run control may not be efficient since some calculations may require in-depth analysis and may be available too late to perform certain types of feedback or feed-forward adjustments. Additionally, performing wafer-to-wafer adjustments may be difficult since certain analysis of manufacturing data may not be available on a wafer-to-wafer basis.

Furthermore, current methodologies involve waiting for a scheduled time, such as the completion of the processing of a certain number of semiconductor wafers 105, before manufacturing-related data is acquired. Current methodologies may call for awaiting a triggering event, such as a catastrophic event during processing, or an interference performed manually by an operator, before manufacturing-related data is acquired. Manufacturing process adjustments are generally made based upon data acquired in response to scheduled intervals and/or triggering events. Therefore, an appreciable number of semiconductor wafers 105 may be processed using non-current manufacturing data. This may cause errors on the processed semiconductor wafers 105 that may otherwise be avoidable.

The present invention is directed to overcoming, or at least reducing, the effects of, one or more of the problems set forth above.

SUMMARY OF THE INVENTION

In one aspect of the present invention, a method is provided for performing dynamic targeting adjustments of a process control system. The method comprises performing a process step upon a first workpiece in a batch based upon a process target setting. The process target setting comprises at least one parameter relating to a target characteristic of the first workpiece. The method further comprises acquiring manufacturing data relating to processing of the first workpiece. The manufacturing data comprises at least one of a metrology data relating to the processed first workpiece and a tool state data relating to the tool state of a processing tool. The method further comprises acquiring electrical data relating to the processed first workpiece at least partially during processing of a second workpiece in the batch and adjusting dynamically the process target setting based upon a correlation of the electrical data with the manufacturing data.

In another aspect of the present invention, a method is provided for dynamically adjusting processing of semiconductor wafers, which comprises processing a semiconductor wafer based upon a process target setting relating to at least one of a yield, quality, and performance of the semiconductor wafer, acquiring metrology data relating to the processed semiconductor wafer based upon at least one of a scheduled interval and a triggering event and acquiring electrical data relating to the processed semiconductor wafer in an approximately real time manner during processing of the batch. The method provided for dynamically adjusting processing of semiconductor wafers further comprises adjusting dynamically the process target setting based upon analysis of the electrical data and the metrology data. The method provided for dynamically adjusting a targeting system for processing semiconductor wafers comprises processing a semiconductor wafer based upon a process target provided by the targeting system, acquiring manufacturing data related to the processed semiconductor wafer, the manufacturing data comprising at least one of a metrology data relating to the processed workpiece and a tool state data relating to a tool state of a processing tool and acquiring electrical data relating to the processed semiconductor wafer during processing of the batch. The method provided for dynamically adjusting a targeting system for processing semiconductor wafers further comprises dynamically adjusting said targeting system based upon said manufacturing data and said electrical data.

In another aspect of the present invention, a system is provided for dynamic targeting for a process control system. The system comprises a processing tool and a process controller operatively coupled to the processing tool. The processing tool processes a workpiece and the process controller performs a dynamic targeting analysis for targeting one or more parameters related to processing the workpiece. The dynamic targeting analysis comprises dynamically adjusting a process target setting related to the one or more parameters based upon an analysis of electrical data relating to the processed workpiece and metrology data related to the processed workpiece.

In yet another aspect of the present invention, a computer readable program storage device encoded with instructions is provided for performing dynamic targeting adjustments of a process control system. A computer readable program storage device encoded with instructions that, when executed by a computer, performs a method, which comprises performing a process step upon a first workpiece in a batch based upon a process target setting, the process target setting comprising at least one parameter relating to a target characteristic of the processed workpiece, acquiring manufacturing data relating to the processing of the workpiece, the manufacturing data comprising at least one of a metrology data relating to the processed workpiece and a tool state data relating to a tool state of a processing tool. The computer readable program storage device encoded with instructions that, when executed by a computer, further performs a method that provides acquiring electrical data relating to the processed first workpiece at least partially during processing of a second workpiece in batch and adjusting dynamically the process target setting based upon a correlation of the electrical data with the manufacturing data.

BRIEF DESCRIPTION OF THE DRAWINGS

The invention may be understood by reference to the following description taken in conjunction with the accompanying drawings, in which like reference numerals identify like elements, and in which.

Figure 1:
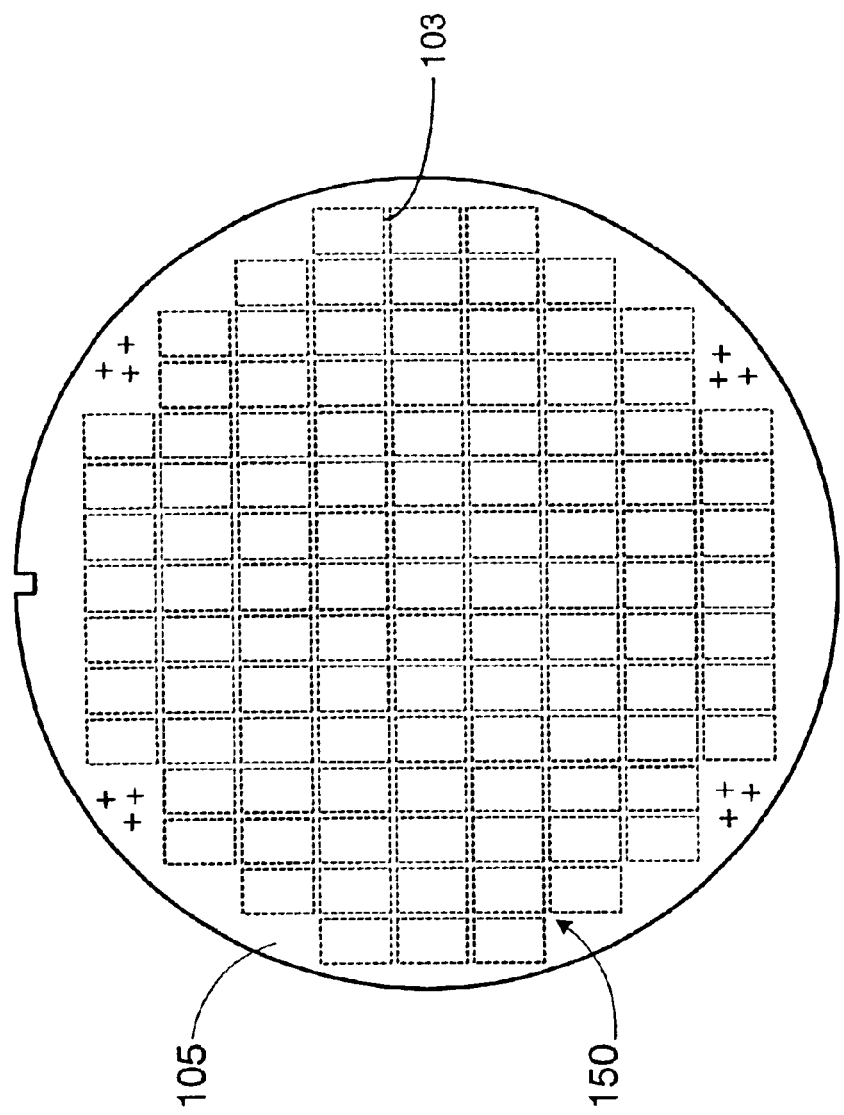
FIG. 1 is a simplified diagram of a prior art semiconductor wafer being processed.
Figure 2:
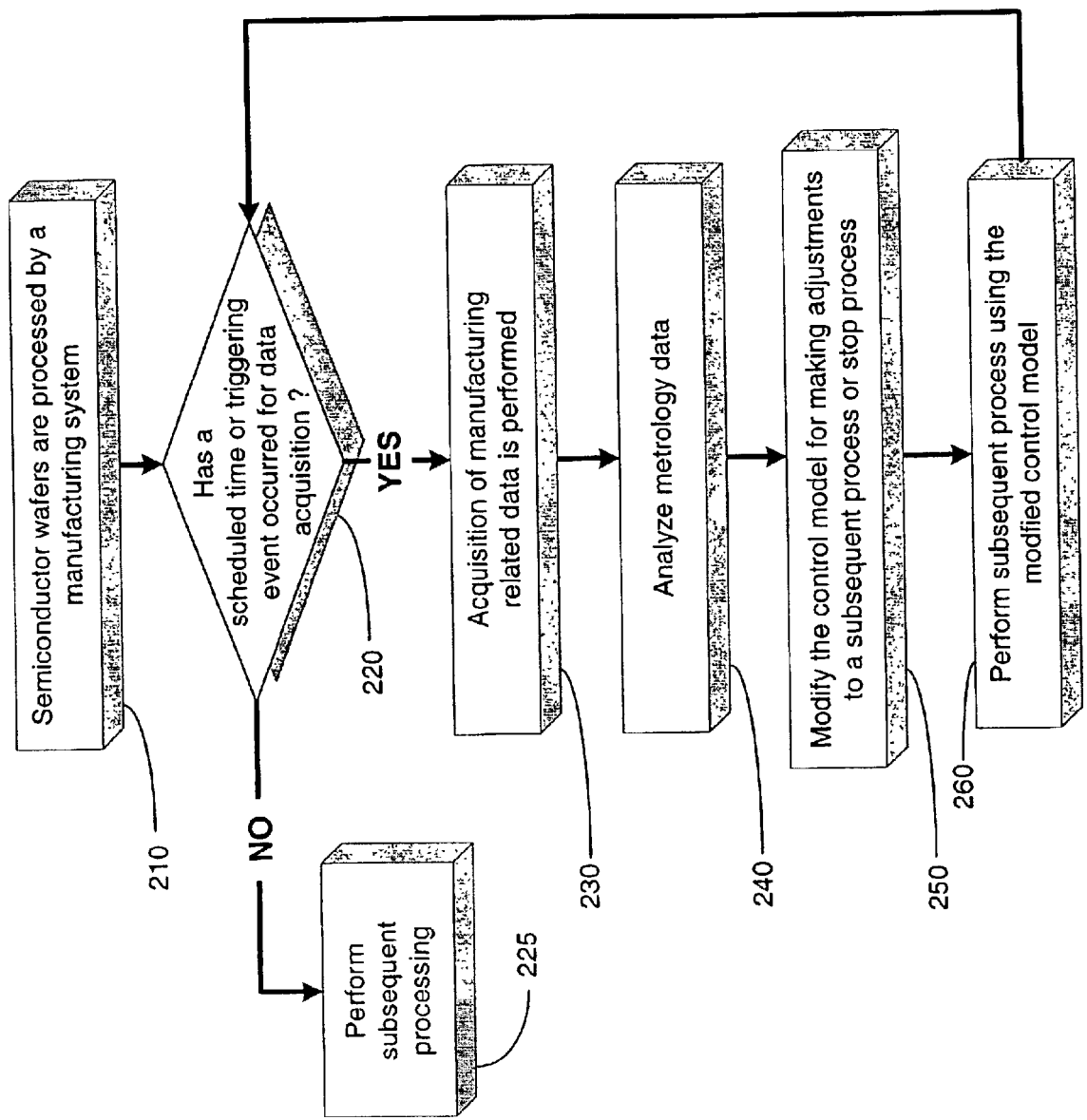
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, workpieces (e.g., semiconductor wafers 105, semiconductor devices, etc.) are stepped through multiple manufacturing process tools. Embodiments of the present invention provide for a supervisory system to acquire manufacturing-related data in addition to manufacturing data acquired during scheduled intervals or in response to triggering events. Embodiments disclosed herein provide for a dynamic targeting system that is capable of performing a persistent type of supervisory control to constantly/dynamically adjust process operations performed on semiconductor wafers 105. In addition to acquiring metrology data and/or tool state data, electrical test data may be acquired on a continuing basis and merged with the metrology and/or tool state data. Therefore, modifications made to the process operations may be performed dynamically using analysis of the electrical test data along with other manufacturing-related data in order to adjust control operations.

A dynamic targeting system may target one or a plurality of processing specifications related to processed semiconductor wafers 105 (e.g., the thickness of a film to be deposited on a semiconductor wafer 105, critical dimensions of structures formed on semiconductor wafers 105, such as gate structures, and the like), to be adjusted dynamically. The dynamic targeting system provided by some embodiments of the present invention provides for performing continuous targeting adjustments to process operations without having to wait for a scheduled time interval or a triggering event. In such embodiments, intense analysis and calculations performed on the manufacturing-related data may be constantly fed to a dynamic targeting system without having to wait for completion of a certain amount of processing. Process operations may continue while a significant amount of calculations and/or analysis on the manufacturing-related data is performed, and therefore, the process operations may be adjusted dynamically.

Figure 3:
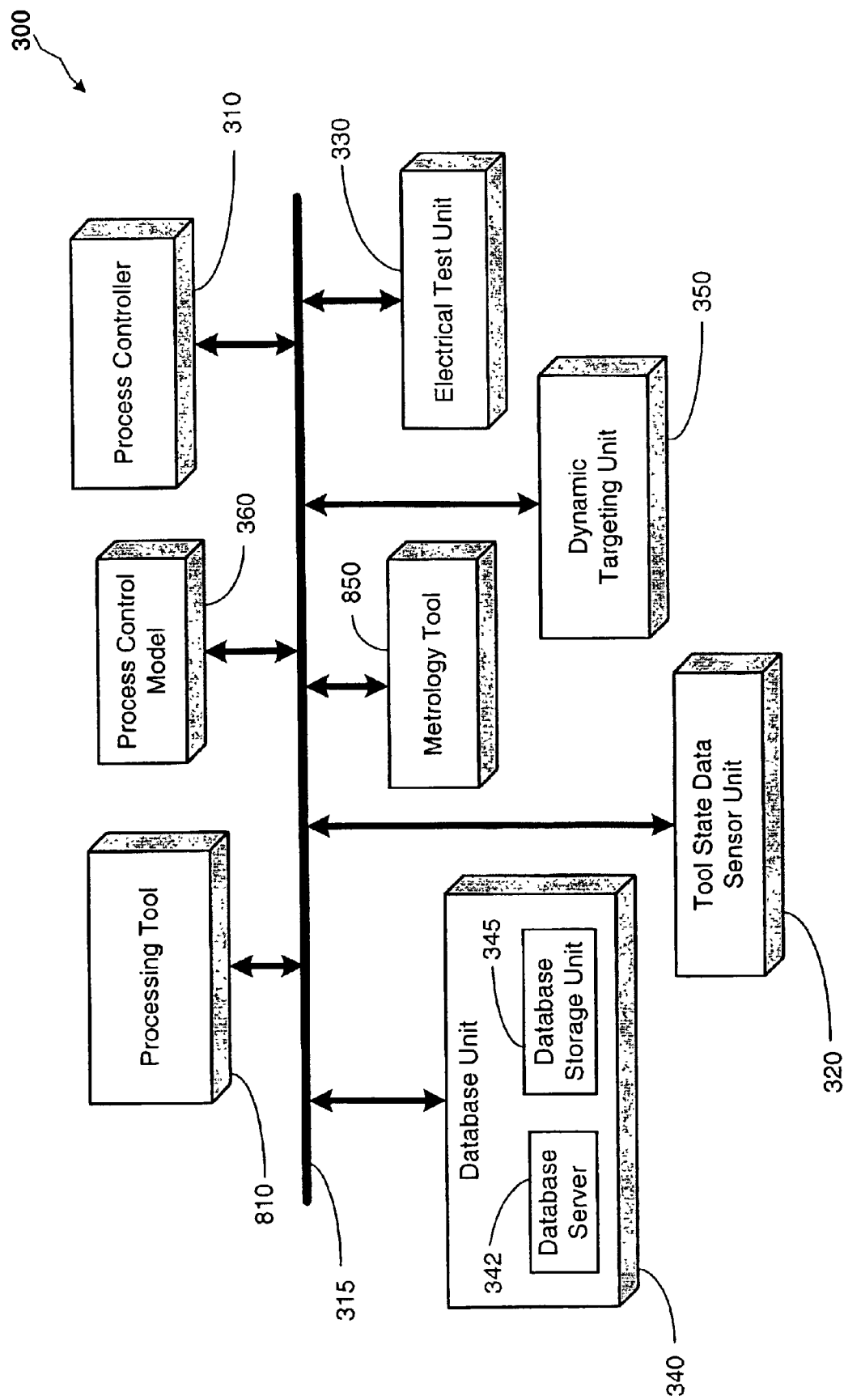
FIG. 3 provides a block diagram representation of a system in accordance with one illustrative embodiment of the present invention.

Turning now to FIG. 3, a system 300 in accordance with embodiments of the present invention is illustrated. A process controller 310 in the system 300 is capable of controlling various operations relating to a processing tool 810. The system 300 is capable of acquiring manufacturing related data, such as metrology data related to processed semiconductor wafers 105, tool state data, and the like. The system 300 may also comprise a metrology tool 850 to acquire metrology data related to the processed semiconductor wafers 105. Operations performed by the processing tool 810 may generally be controlled by a process control model 360. The process control model 360 may define various control parameters and perform other control functions that manage the operations of the processing tool 810.

The system 300 may also comprise a database unit 340. The database unit 340 is provided for storing a plurality of types of data, such as manufacturing-related data, data related to the operation of the system 300 (e.g., the status of the processing tool 810, the status of semiconductor wafers 105, etc.). The database unit 340 may store tool state data relating to a plurality of process runs performed by the processing tool 810. The database unit 340 may comprise a database server 342 for storing tool state data and/or other manufacturing data related to processing semiconductor wafers 105, into a database storage unit 345.

The system 300 may also comprise a tool state data sensor unit 320 for acquiring tool state data. The tool state data may include pressure data, temperature data, humidity data, gas flow data, various electrical data, and the like. Exemplary tool state data for an etch tool may include gas flow, chamber pressure, chamber temperature, voltage, reflected power, backside helium pressure, RF tuning parameters, etc. The tool state data may also include data external to the processing tool 810, such as ambient temperature, humidity, pressure, etc. A more detailed illustration and description of the tool state data sensor unit 320 is provided in FIG. 4 and accompanying description below.

The system 300 comprises a dynamic targeting unit 350 for performing dynamic adjustments based upon the results of dynamically targeting one or more processes or process specifications. Dynamic targeting may include constantly adjusting the target specifications or characteristics relating to processed semiconductor wafers 105, such as target critical dimensions of features formed on the semiconductor wafers 105, target film thickness of a particular layer deposited on a semiconductor wafer 105, and the like. The target characteristics may also include the yield, quality, and/or performance of the processed semiconductor wafers 105 and/or devices manufactured from the processed semiconductor wafers 105. The dynamic targeting unit 350 is capable of analyzing data from the metrology tool 850, data acquired by the tool state data sensor unit 320, and/or data acquired by the electrical test unit 330. Moreover, the dynamic targeting unit 350 is capable of merging/correlating and performing analysis of the data on a real time basis. Performing analysis on a real time basis, in one embodiment, includes performing analysis on data related to one or more processed semiconductor wafers 105 in a batch/lot, while other semiconductor wafers 105 in the lot are being processed.

The dynamic targeting unit 350 may perform constant adjustments to the process operations performed on the semiconductor wafer 105 without waiting for scheduled intervals and/or triggering events during processing of semiconductor wafers 105. In one embodiment, the dynamic targeting unit 350 provides control adjustments to the process control model 360 (e.g., feedback and/or feed forward adjustments) to control process operations performed on semiconductor wafers 105. A more detailed illustration and description of the dynamic targeting unit 350 is provided in FIG. 6 and accompanying description below.

The process controller 310, the process control model 360, and/or the dynamic targeting unit 350, may be software, hardware, or firmware units that are standalone units or may be integrated into a computer system associated with the system 300. Furthermore, the various components represented by the blocks illustrated in FIG. 3 may communicate with one another via a system communications line 315. The system communications line 315 may be a computer bus link, a dedicated hardware communications link, a telephone system communications link, a wireless communications link, or other communication links that may be implemented by those skilled in the art having benefit of the present disclosure.

Figure 4:
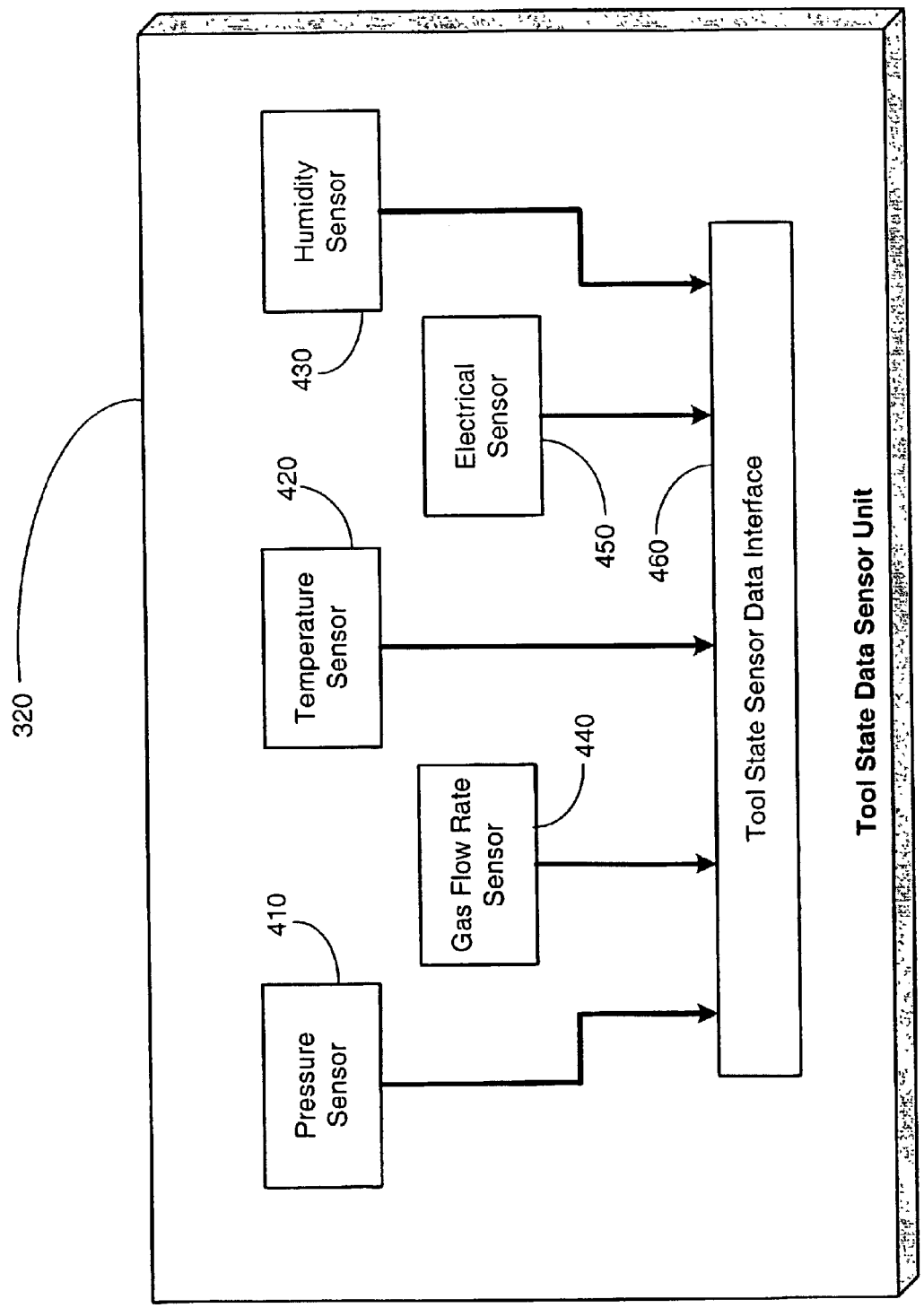
FIG. 4 illustrates a more detailed block diagram representation of a tool state data sensor unit of FIG. 3, in accordance with one illustrative embodiment of the present invention.

Turning now to FIG. 4, a more detailed block diagram depiction of the tool state data sensor unit 320 illustrated in FIG. 3 is provided. The tool state data sensor unit 320 may comprise any of a variety of different types of sensors, e.g., a pressure sensor 410, a temperature sensor 420, a humidity sensor 430, a gas flow rate sensor 440, and an electrical sensor 450, etc. The pressure sensor 410 is capable of detecting the pressure within the processing tool 810. The temperature sensor 420 is capable of sensing the temperature of various portions of the processing tool 810. The humidity sensor 430 is capable of detecting the relative humidity at various portions in the processing tool 810, or of the surrounding ambient conditions. The gas flow rate sensor 440 may comprise a plurality of flow-rate sensors that are capable of detecting the flow-rate of a plurality of process gases utilized during processing of semiconductor wafers 105. For example, the gas flow rate sensor 440 may comprise sensors that can detect the flow rate of gases such as $NH_3$, $SiH_4$, $N_2$, $N_2O$, and/or other process gases.

In one embodiment, the electrical sensor 450 is capable of detecting a plurality of electrical parameters, such as the current provided to a lamp used in a photolithography process. The tool state data sensor unit 320 may also comprise other sensors capable of detecting a variety of manufacturing variables known to those skilled in the art having benefit of the present disclosure. The tool state data sensor unit 320 may also comprise a tool state sensor data interface 460. The tool state sensor data interface 460 may receive sensor data from the various sensors that are contained within, or associated with, the processing tool 810 and/or tool state data sensor unit 320 and transmit the data to the process controller 310.

Figure 5:
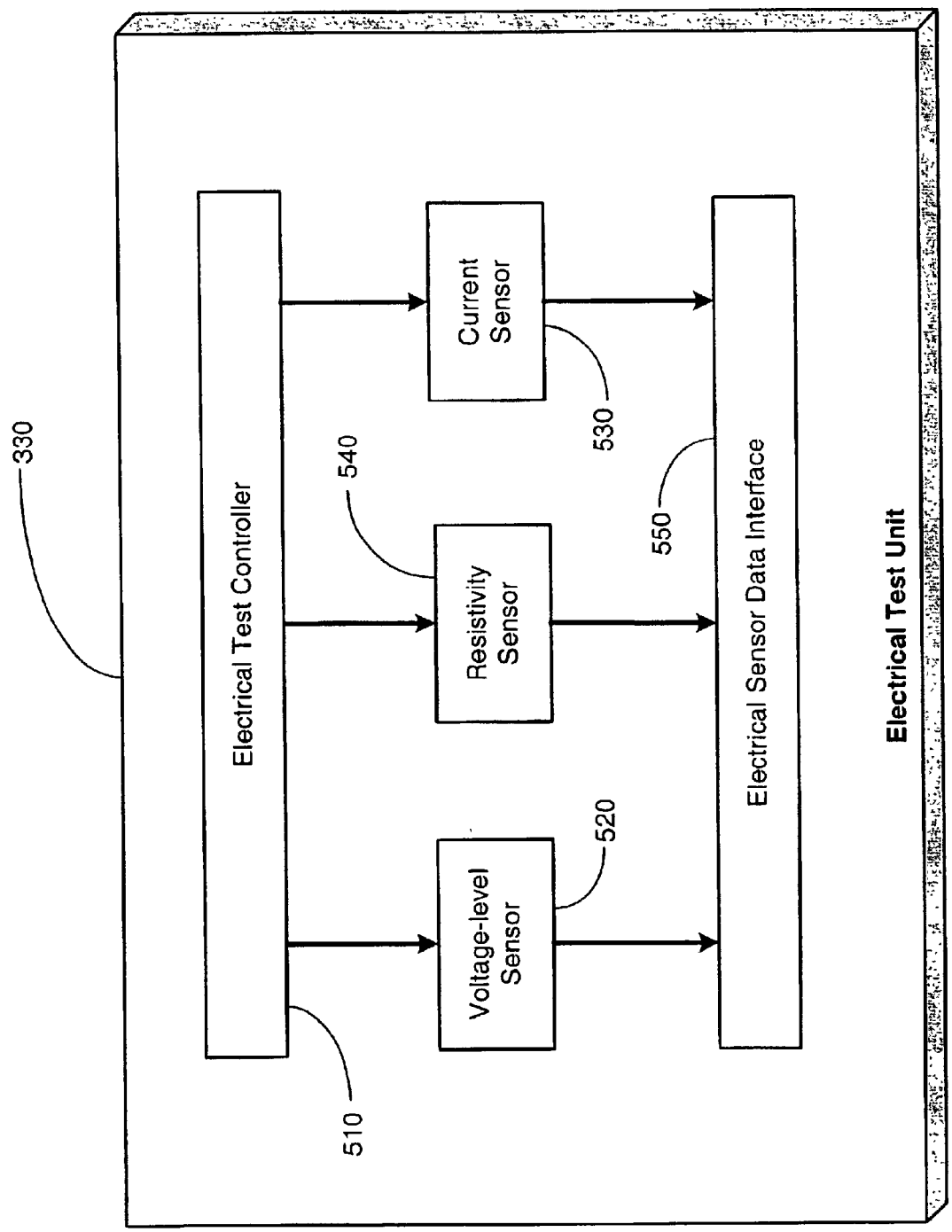
FIG. 5 illustrates a more detailed block diagram representation of an electrical test unit of FIG. 3, in accordance with one illustrative embodiment of the present invention.

Turning now to FIG. 5, a more detailed block diagram illustration of the electrical test unit 330 is provided. The electrical test unit 330 may comprise an electrical test controller 510, which may receive data from the dynamic targeting unit 350 for the selection of a particular type of electrical test to be performed on selected semiconductor wafers 105. For example, the dynamic targeting unit 350 may determine that a particular thickness of a certain film deposited on a semiconductor wafer 105 is a key parameter that is to be monitored. In an alternative embodiment, the dynamic targeting unit 350 may determine that a critical dimension parameter relating to a gate structure formed on the semiconductor wafers 105 may be of high importance for monitoring and analysis. As a result of targeting these parameters, many electrical tests may be performed by the electrical test unit 330.

Based upon data from the dynamic targeting unit 350, the electrical test controller 510 may determine which type of sensor to activate for performing the electrical test. For example, the electrical test controller 510 may invoke the voltage level sensor 520, or the current sensor 530, or a resistivity sensor 540. The sensors 520, 530, 540 may be integrated into a single electrical test unit 330 or may be standalone units that are operationally associated with the electrical test unit 330. If the dynamic targeting unit 350 determines that the thickness of a particular layer of the semiconductor wafer 105 is of high importance, the resistivity sensor 540 may be invoked since resistivity measurements are generally affected by film thickness of conductive films. As another example, if the dynamic targeting unit 350 determines that a particular critical dimension of a gate structure formed on the semiconductor wafers 105 is of high importance, the current sensor 530 may be invoked, since a drive current measured on the semiconductor wafer 105 may be associated with a particular critical dimension on the semiconductor wafer 105. Data acquired by the sensors 520, 530, 540 may be sent to the various components of the system 300 via the electrical sensor data interface 550, which provides for a pathway for data from the sensors 520, 530, 540 to various other components of the system 300.

Figure 6:
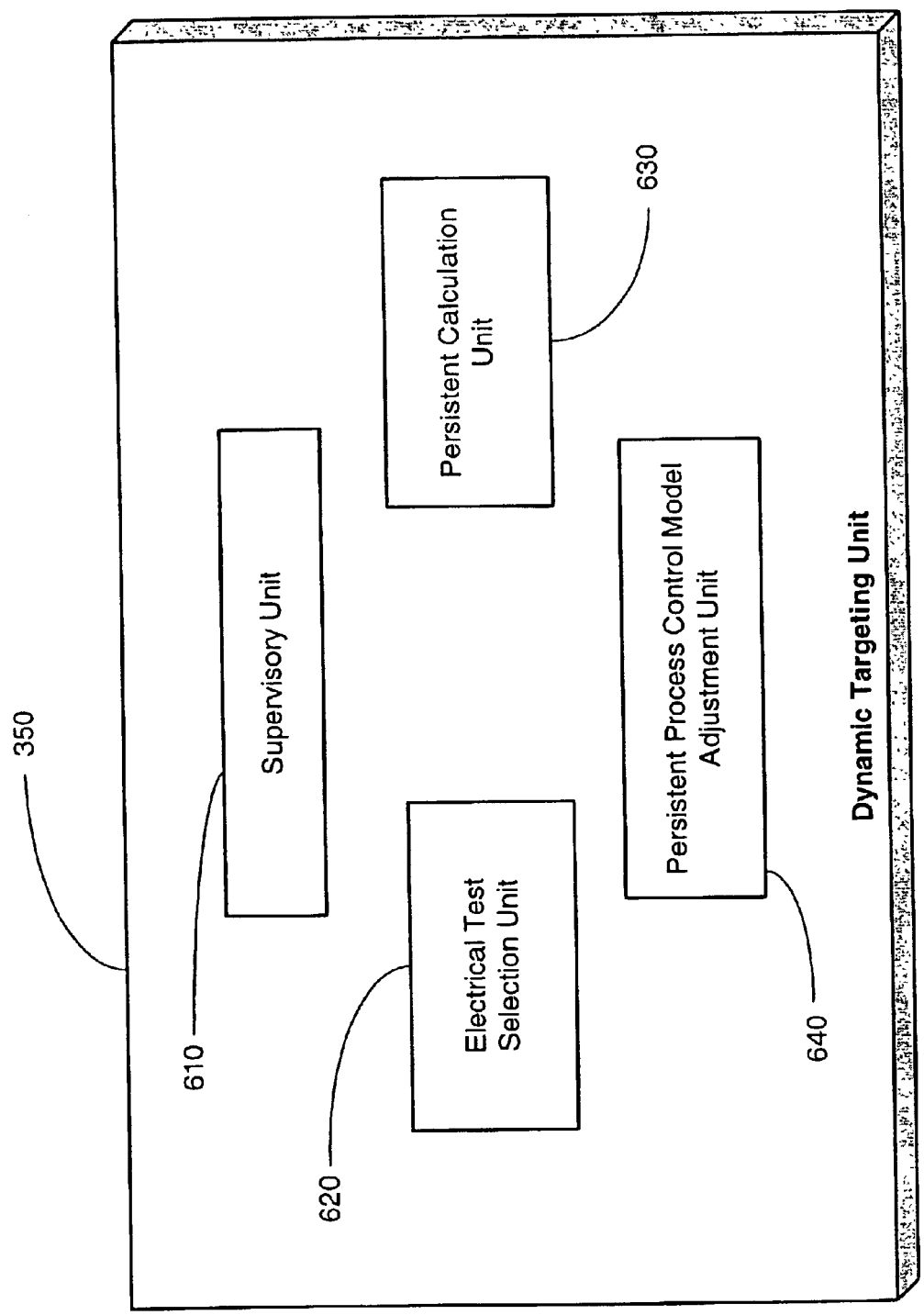
FIG. 6 illustrates a more detailed block diagram representation of a dynamic targeting unit of FIG. 3, in accordance with one illustrative embodiment of the present invention.

Turning now to FIG. 6, a block diagram depiction of the dynamic targeting unit 350 is illustrated. The dynamic targeting unit 350 may comprise a supervisory unit 610, an electrical test selection unit 620, a persistent calculation unit 630, and a persistent process control model adjustment unit 640. The supervisory unit 610 performs a dynamic supervisory function that includes monitoring the process operations performed by the system 300 and adjusting the control parameters affecting the process operations. The supervisory unit 610 may select particular dynamic targeting functions based upon the metrology data, the tool state data, and certain electrical test data, along with inputs from other components of the system 300 (e.g., inputs from an operator indicating which parameter(s) to test, such as thickness, critical dimensions etc.) that are to be closely monitored. The supervisory unit 610 may determine particular areas of interest relating to the semiconductor wafers 105 for monitoring, analyzing, and/or performing adjustments. For example, the supervisory unit 610 may determine that the thickness or the critical dimension of a particular structure on the semiconductor wafers 105 is to be given priority for monitoring and analysis. Based upon particular decisions made by the supervisory unit 610 relating to the importance of certain parameters, such as thickness and/or critical dimensions, the electrical test selection unit 620 provides data, which relates to the type of electrical test to be performed on the semiconductor wafers 105, to the electrical test unit 330.

The persistent calculation unit 630 may continuously perform merging, correlating, and/or analysis functions on the data received by the dynamic targeting unit 350. Based upon calculations performed by the persistent calculation unit 630, the persistent process control model adjustment unit 640 may provide data to the process control model 360, indicating adjustments that may be implemented to the process operations performed on the semiconductor wafers 105. The persistent process control model adjustment unit 640 may generate data that targets the best possible configuration for performing certain processes; the best configuration for optimization(s) of existing processes; and the like. Data from the dynamic targeting unit 350 is then used to dynamically adjust processing operations performed on the semiconductor wafers 105.

Figure 7:
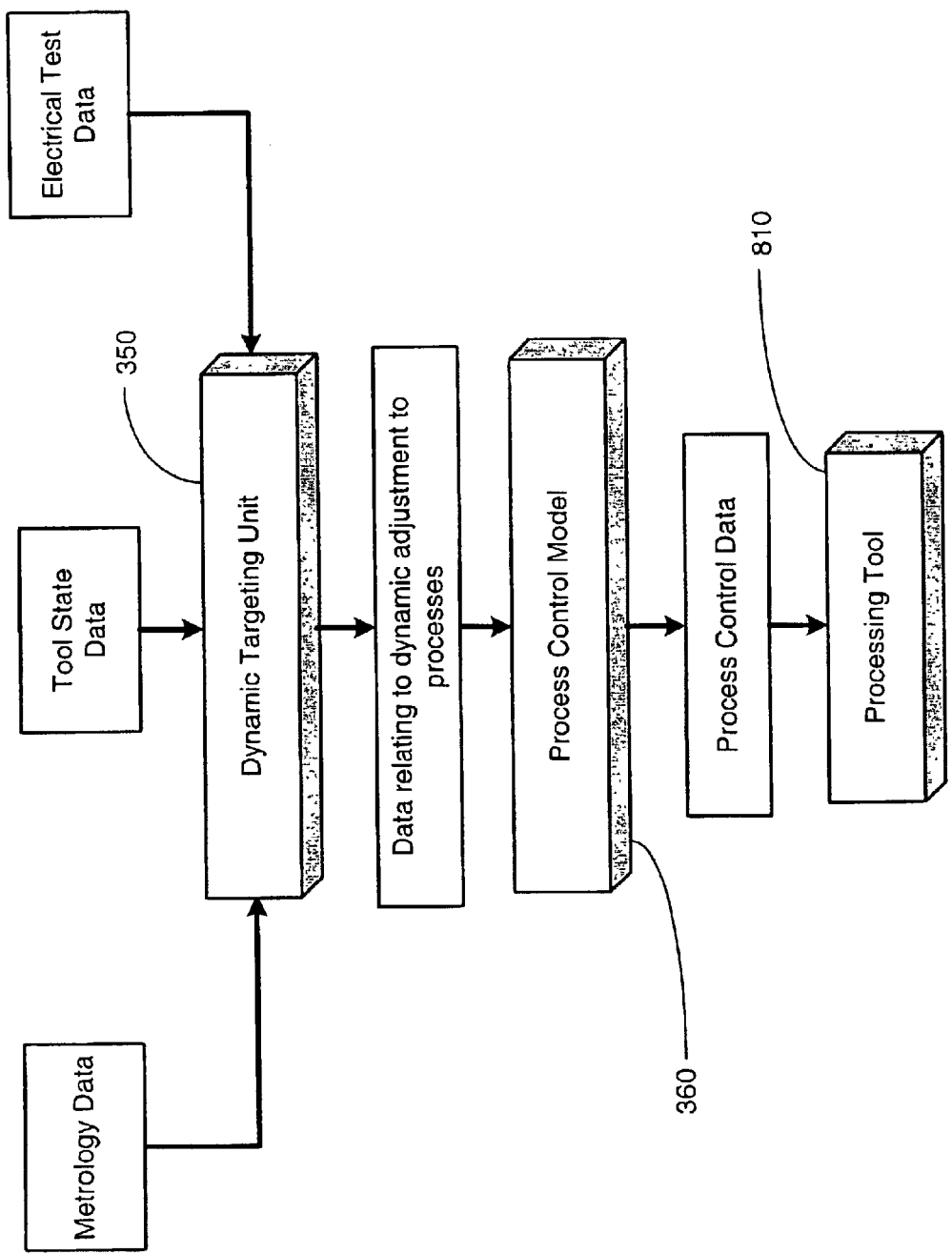
FIG. 7 illustrates a block diagram data flow relating to performing a dynamic target control process, in accordance with one illustrative embodiment of the present invention.

Turning now to FIG. 7, a flowchart depicting the flow of data relating to the dynamic targeting unit 350 is illustrated. Metrology data, tool state data, and/or electrical test data are provided to the dynamic targeting unit 350. Based upon the description provided above, the dynamic targeting unit 350 may generate data relating to dynamic adjustments to be made to processes performed on the semiconductor wafers 105. This generated data is received by the process control model 360, which may then implement process control adjustments. The process control model 360 provides process control data to the processing tool 810. The process control data is used by the processing tool 810 to perform processes on semiconductor wafers 105 based upon dynamic targeting. The process control data may be provided and/or changed dynamically, such that dynamic changes to the operation of the processing tool 810 may be made.

Figure 8:
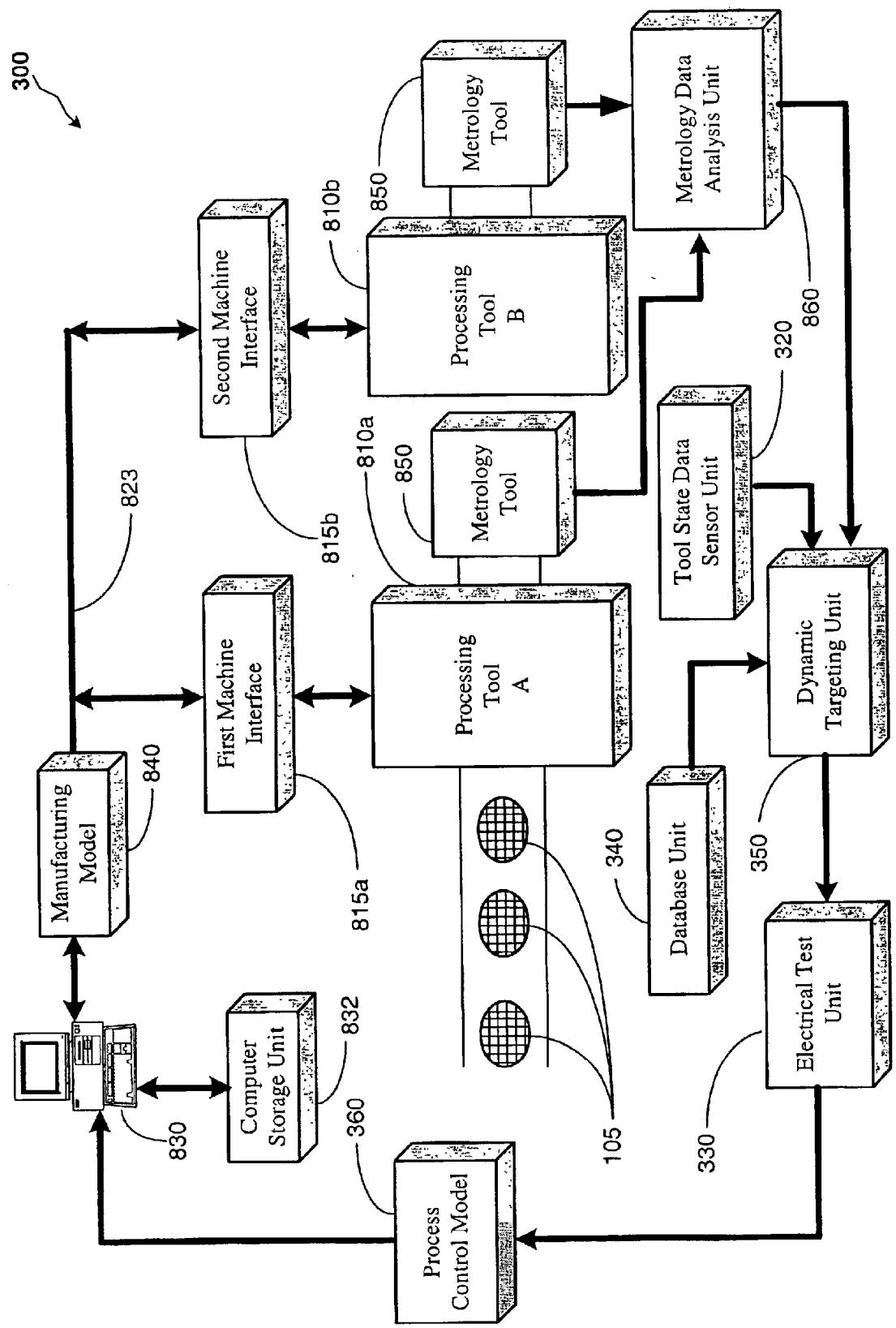
FIG. 8 illustrates a more detailed block diagram representation of the system shown in FIG. 3, in accordance with one illustrative embodiment of the present invention.

Turning now to FIG. 8, a more detailed block diagram of the system 300 in accordance with one embodiment of the present invention is illustrated. Semiconductor wafers 105 are processed on processing tools 810a, 810b using a plurality of control input signals, or manufacturing parameters, provided via a line or network 823. The control input signals, or manufacturing parameters, on the line 823 are sent to the processing tools 810a, 810b from a computer system 830 via machine interfaces 815a, 815b. The first and second machine interfaces 815a, 815b are generally located outside the processing tools 810a, 810b. In an alternative embodiment, the first and second machine interfaces 815a, 815b are located within the processing tools 810a, 810b. The semiconductor wafers 105 are provided to and carried from a plurality of processing tools 810. In one embodiment, semiconductor wafers 105 may be provided to a processing tool 810 manually. In an alternative embodiment, semiconductor wafers 105 may be provided to a processing tool 810 in an automatic fashion (e.g., robotic movement of semiconductor wafers 105). In one embodiment, a plurality of semiconductor wafers 105 is transported in lots (e.g., stacked in cassettes) to the processing tools 810.

In one embodiment, the computer system 830 sends control input signals, or manufacturing parameters, on the line 823 to the first and second machine interfaces 815a, 815b. The computer system 830 is capable of controlling processing operations. In one embodiment, the computer system 830 is a process controller. The computer system 830 is coupled to a computer storage unit 832 that may contain a plurality of software programs and data sets. The computer system 830 may contain one or more processors (not shown) that are capable of performing the operations described herein. The computer system 830 employs a manufacturing model 840 to generate control input signals on the line 823. In one embodiment, the manufacturing model 840 contains a manufacturing recipe that determines a plurality of control input parameters that are sent on the line 823 to the processing tools 810a, 810b.

In one embodiment, the manufacturing model 840 defines a process script and input control that implement a particular manufacturing process. The control input signals (or control input parameters) on the line 823 that are intended for processing tool A 810a are received and processed by the first machine interface 815a. The control input signals on the line 823 that are intended for processing tool B 810b are received and processed by the second machine interface 815b. Examples of the processing tools 810a, 810b used in semiconductor manufacturing processes are steppers, etch process tools, deposition tools, and the like.

One or more of the semiconductor wafers 105 that are processed by the processing tools 810a, 810b can also be sent to a metrology tool 850 for acquisition of metrology data. The metrology tool 850 may be a scatterometry data acquisition tool, an overlay-error measurement tool, a critical dimension measurement tool, and the like. In one embodiment, a metrology tool 850 examines one or more processed semiconductor wafers 105. The metrology data analysis unit 860 may collect, organize, and analyze data from the metrology tool 850. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data may be used to determine faults that may be present across the processed semiconductor wafers 105, which may be used to quantify the performance of the processing tools 810.

As described above, metrology data from the metrology data analysis unit 860 is provided to the dynamic targeting unit 350, along with the data from the electrical test unit 330 and/or the data from the tool state data sensor unit 320. The dynamic targeting unit 350 then analyzes and provides dynamic targeting adjustment data to the process control model 360. The process control model 360 then provides data to the computer system 830 for adjusting subsequent processes. The computer system 830 may then provide modifications to the manufacturing model 840, which then dynamically adjusts operations of the processing tools 810a, 810b.

Figure 9:
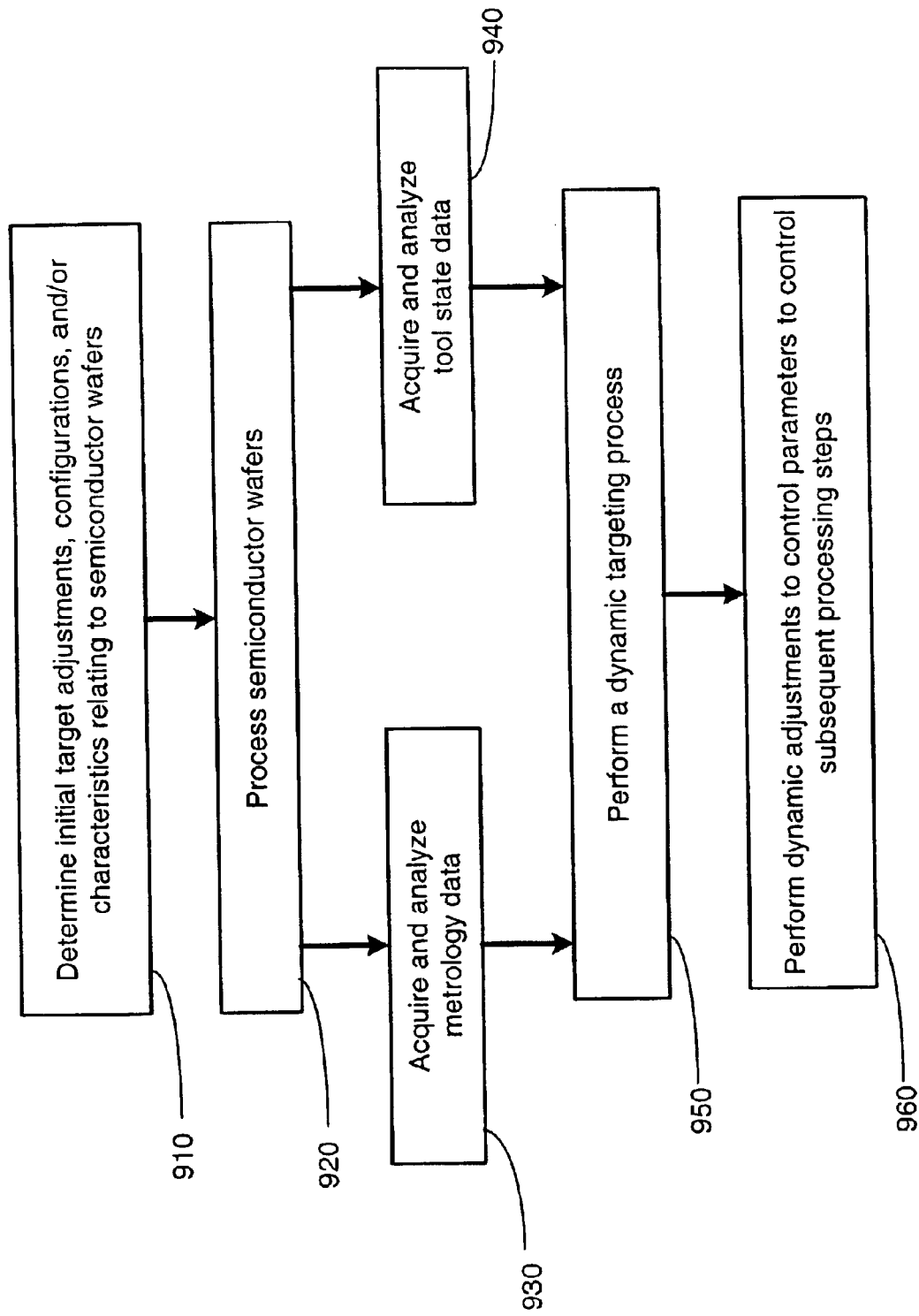
FIG. 9 illustrates a flowchart depiction of a method in accordance with one illustrative embodiment of the present invention.

Turning now to FIG. 9, a flow chart depiction of the method in accordance with embodiments of the present invention is provided. The system 300 determines an initial target for adjustments or configurations relating to processing of semiconductor wafers 105, and/or initial target characteristics relating to processed semiconductor wafers 105 (block 910). The initial target relates to the type of processing to be performed on the semiconductor wafers 105. The initial target also relates to the adjustments and/or the targets relating to the particular measurements, such as critical dimension measurements, film thickness, etc., relating to processed semiconductor wafers 105 that may result based upon the initial target settings. The initial target may also include target characteristics relating to the yield, quality, and performance of processed semiconductor wafers 105 that may result based upon the initial target settings. Using the initial target settings, the system 300 performs process operations on the semiconductor wafers 105 (block 920).

The system 300 then generally acquires and analyzes metrology data relating to the processed semiconductor wafers 105 (block 930). The metrology data is generally acquired by the metrology tool 850. The system 300 may also acquire and analyze tool state data that may be acquired by the tool state data sensor unit 320 (block 940). Based upon the analyzed metrology data and the analyzed tool state data, the system 300 may perform a dynamic targeting process (block 950). In some cases, the dynamic targeting process provides for dynamic adjustments that may be implemented on processing steps performed on the semiconductor wafers 105. More specifically, in some cases, the dynamic targeting process provides for real time adjustments to processes performed on a second workpiece in a lot based upon an analysis of the processing of a first workpiece from the same lot. A more detailed illustration and description of performing the dynamic targeting process indicated in block 950 of FIG. 9, is provided in FIG. 10 and accompanying description below.

Upon performing the dynamic target processing, dynamic adjustment control parameters are used to perform subsequent processes by the system 300 (block 960). Therefore, constant adjustments based upon dynamic modifications made to the target relating to processing and/or relating to the features of semiconductor wafers 105 are implemented throughout the processing procedures performed by the system 300.

Figure 10:
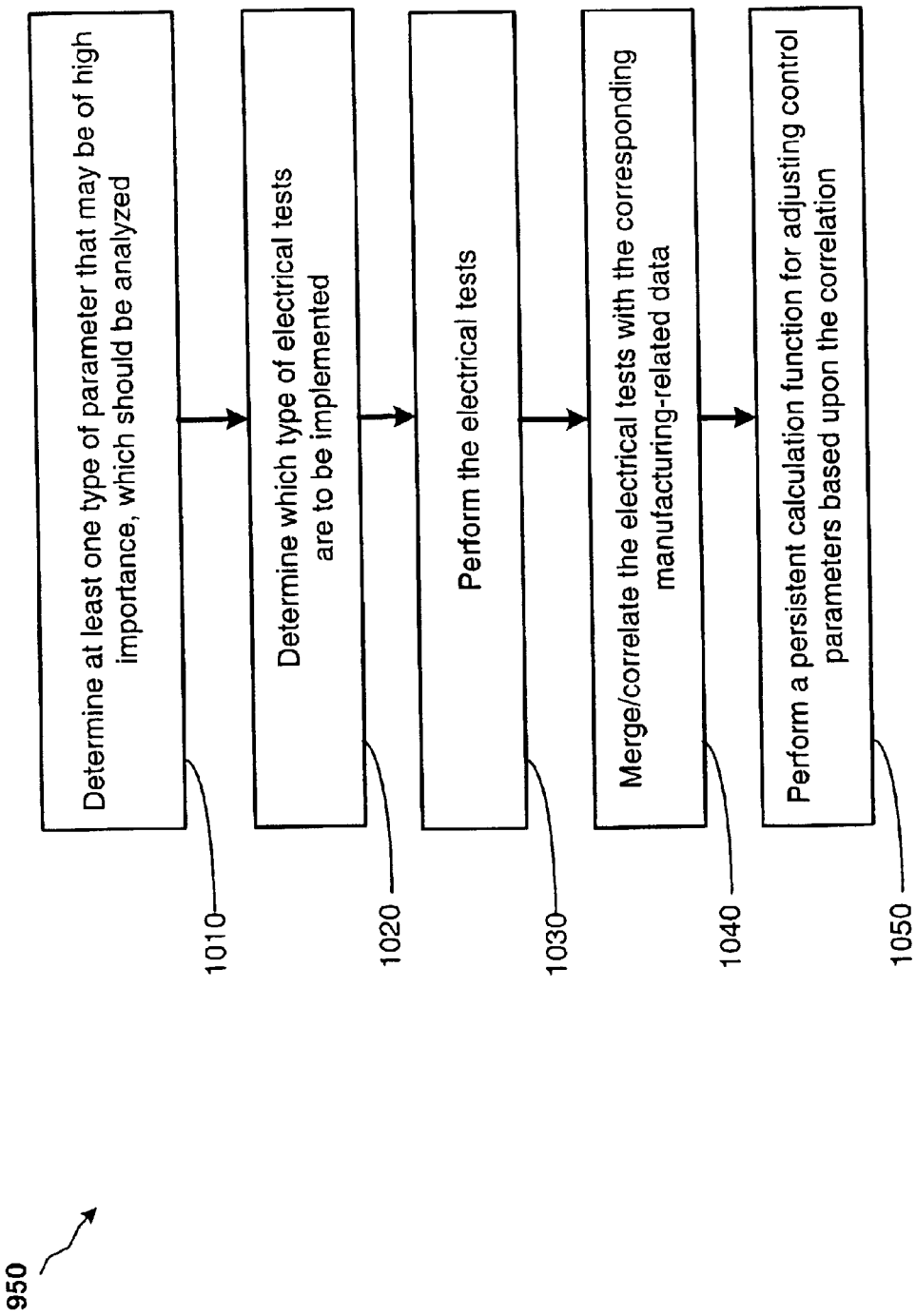
FIG. 10 illustrates a more detailed flowchart depiction of a method of performing a dynamic targeting process, as indicated in FIG. 9, in accordance with one illustrative embodiment of the present invention.

Turning now to FIG. 10, a more detailed illustration of performing the dynamic targeting process indicated in block 950 of FIG. 9 is provided. The system 300 determines at least one type of parameter that may be of high importance, which should be analyzed (block 1010) For example, the system 300 may determine that a particular critical dimension relating to a gate formed on the semiconductor wafers 105 is to be monitored closely. The system may also determine target process outcome, such as yield of the processed semiconductor wafers 105, based upon particular parameters. The system 300 may then use the selected parameter(s) to determine which type of electrical tests are to be implemented (block 1020). For example, based upon a determination that two parameters, (e.g., the thickness of a certain semiconductor wafer 105 and a critical dimension of a particular feature on the semiconductor wafer 105) are to be monitored, one or more electrical tests are selected. In response, the electrical test unit 330 is prompted to perform electrical tests on a drive current associated with the critical dimension of the gate structure and a resistivity measurement relating to the thickness of the layer on the semiconductor wafer 105. Therefore, the selected electrical tests, in this case, the resistivity and the current electrical tests/measurements, are performed (block 1030).

The system 300 may then merge/correlate the electrical test data with the corresponding manufacturing-related data (e.g., the metrology data and/or the tool state data) (block 1040). The merging/correlating of the sets of data described above includes correlating certain electrical test data, for example the drive current, with the critical dimension measurements measured by the metrology data. Furthermore, the correlated electrical test data and the critical dimension data may be associated with particular tool state data, such as the temperature or gas flow rates during the processing of the semiconductor wafer 105. Based upon such correlation of the data, the system 300 may perform a persistent calculation function for adjusting control parameters (block 1050). In other words, the merged and/or the correlated data may be used to continuously calculate modifications to certain parameters that may be implemented in a feedback or a feed-forward manner for adjusting control parameters of process operations. The system 300 then provides the data relating to adjusting parameters (e.g., feedback and/or feed forward data) to the process control model 360 for implementation of the adjustments to the processes performed on the semiconductor wafers 105. The completion of the steps illustrated in FIG. 10 substantially completes the process of performing the dynamic targeting process indicated in block 950 of FIG. 9.

Utilizing embodiments of the present invention, a dynamic measurement, particularly electrical measurements, are performed in conjunction with the analysis of metrology data and/or tool state data to perform a dynamic targeting adjustment to the processing of semiconductor wafers 105. Therefore, adjustments to the process operations can be made based upon the dynamic adjustments relating to the targeting of certain qualities of processed semiconductor wafers 105. Utilizing embodiments of the present invention, a robust set of processed semiconductor wafers 105 may be achieved.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC framework is a preferred platform from which to implement the control strategy taught by the present invention. In some embodiments, the APC framework can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC framework allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

performing a process step upon a workpiece in a batch based upon a process target setting, said process target setting comprising at least one parameter relating to a target characteristic of said first workpiece;

acquiring manufacturing data relating to processing of said first workpiece, said manufacturing data comprising at least one of a metrology data relating to said processed first workpiece and a tool state data relating to the tool state of a processing tool;

acquiring electrical data relating to said processed workpiece at least partially during a time period during another workpiece in said batch is under process control; and adjusting dynamically said process target setting based upon a correlation of said electrical data with said manufacturing data.

2. The method of claim 1, wherein performing said process step upon said workpieces further comprises performing said process step upon a semiconductor wafer.

3. The method of claim 2, wherein performing a process step upon at least one workpiece based upon said process target setting further comprises performing a process step upon said semiconductor wafer based upon a target critical dimension relating to a feature formed upon said semiconductor wafer.

4. The method of claim 2, wherein performing a process step upon at least one workpiece based upon said process target setting further comprises performing a process step upon said semiconductor wafer based upon a target thickness associated with a layer formed upon said semiconductor wafer.

5. The method of claim 1, wherein acquiring said metrology data relating to said processed workpiece further comprises acquiring metrology data using a metrology tool.

6. The method of claim 1, wherein acquiring said tool state data relating to said processed workpiece further comprises acquiring at least one of a temperature data, a humidity data, a pressure data, and a gas flow rate data.

7. The method of claim 1, wherein acquiring dynamically electrical data relating to said processed workpiece further comprises employing a supervisory control to dynamically acquire electrical data relating to said processed workpiece.

8. The method of claim 7, wherein acquiring dynamically electrical data relating to said processed workpiece further comprises acquiring at least one of a voltage-level data, a current-level data, and a resistivity data.

9. The method of claim 8, wherein acquiring said resistivity data further comprises acquiring resistivity data relating to a thickness of a layer of said workpiece.

10. The method of claim 8, wherein acquiring paid current-level data further comprises acquiring drive current-level data relating to the critical dimension of a feature formed upon said workpiece.

11. The method of claim 1, wherein adjusting dynamically said process target setting further comprises updating said process target in a real time supervisory manner based upon said correlation of said electrical data with at least one of said metrology data and said tool state data.

12. A method for dynamically adjusting processing of semiconductor wafers, comprising:

processing a semiconductor wafer based upon a process target setting relating to at least one of a yield, quality, and performance of said semiconductor wafer in a batch;

acquiring metrology data relating to said processed semiconductor wafer based upon at least one of a scheduled interval and a triggering event;

acquiring electrical data relating to said processed semiconductor wafer in an approximately real time manner during processing of said batch; and adjusting dynamically said process target setting based upon analysis of said electrical data and said metrology data.

13. The method of claim 12, further comprising acquiring tool state data relating to said processing of said semiconductor wafer and adjusting dynamically said process target setting based upon analysis of said electrical data said metrology data, and said tool state data.

14. A method for dynamically adjusting a targeting system for processing semiconductor wafers, comprising:

processing a semiconductor wafer in a batch based upon a process target;

acquiring manufacturing data related to said processed semiconductor wafer, said manufacturing data comprising at least one of a metrology data relating to said processed workpiece and a tool state data relating to a tool state of a processing tool;

acquiring electrical data relating to said processed semiconductor wafer during processing of said batch; and dynamically adjusting said targeting system based upon said manufacturing data and said electrical data.

15. The method of claim 14, wherein processing a semiconductor wafer based upon a process target provided by said targeting system further comprises processing said semiconductor wafer based upon at least one of a target yield, target quality, and target performance relating to said semiconductor wafer.

16. The method of claim 15, wherein dynamically adjusting said targeting system further comprises adjusting at last one of said target yield, target quality, and target performance relating to said semiconductor wafer in a real time manner.

17. A computer readable program storage device encoded with instructions that, when executed by a computer, performs a method, comprising:

performing a process step upon a workpiece in a batch based upon a process target setting, said process target setting comprising at least one parameter relating to a target characteristic of said first workpiece;

acquiring manufacturing data relating to processing of said first workpiece, said manufacturing data comprising at least one of a metrology data relating to said processed first workpiece and a tool state data relating to the tool state of a processing tool;

acquiring electrical data relating to said processed workpiece at least partially during a time period during another workpiece in said batch is under process control; and adjusting dynamically said process target setting based upon a correlation of said electrical data with said manufacturing data.

18. The computer readable program storage device encoded with instructions that, when executed by a computer, performs the method of claim 17, wherein performing said processing step upon said first and second workpieces further comprises performing said processing step upon a semiconductor wafer.

19. The computer readable program storage device encoded with instructions that, when executed by a computer, performs the method of claim 18, wherein performing a process step upon at least one workpiece based upon said process target setting further comprises performing a process step upon said semiconductor wafer based upon a target critical dimension relating to a feature formed upon said semiconductor wafer.

20. The computer readable program storage device encoded with instructions that, when executed by a computer, performs the method of claim 18, wherein performing a process step upon at least one workpiece based upon said process target setting further comprises performing a process step upon said semiconductor wafer based upon a target thickness associated with a layer formed upon said semiconductor wafer.

21. The computer readable program storage device encoded with instructions that, when executed by a computer, performs the method of claim 17, wherein acquiring said metrology data relating to said processed workpiece further comprises acquiring metrology data using a metrology tool.

22. The computer readable program storage device encoded with instructions that, when executed by a computer, performs the method of claim 17, wherein acquiring said tool state data relating to said processed workpiece further comprises acquiring at least one of a temperature data, a humidity data, a pressure data, and a gas flow rate data.

23. The computer readable program storage device encoded with instructions that, when executed by a computer, performs the method of claim 17, wherein acquiring dynamically electrical data relating to said processed workpiece further comprises employing a supervisory control to dynamically acquire said electrical data relating to said processed workpiece.

24. The computer readable program storage device encoded with instructions that, when executed by a computer, performs the method of claim 23, wherein acquiring dynamically electrical data relating to said processed workpiece further comprises acquiring at least one of a voltage-level data, a current-level data, and a resistivity data.

25. The computer readable program storage device encoded with instructions that, when executed by a computer, performs the method of claim 24, wherein acquiring said resistivity data further comprise acquiring resistivity data relating to a thickness of a layer of said workpiece.

26. The computer readable program storage device encoded with instructions that, when executed by a computer, performs the method of claim 24, wherein acquiring said current-level data further comprises acquiring drive current-level data relating to the critical dimension of a feature formed upon said workpiece.

27. The computer readable program storage device encoded with instructions that, when executed by a computer, performs the method of claim 17, wherein adjusting dynamically said process target setting further comprises updating said process target in a real time supervisory manner based upon said correlation of said electrical data with at least one of said metrology data and said tool state data.

* * * * *

UNITED STATES PATENT AND TRADEMARK OFFICE
CERTIFICATE OF CORRECTION

PATENT NO.     : 6,773,931 B2
DATED          : August 10, 2004
INVENTOR(S)    : Alexander J. Pasadyn, Thomas J. Sonderman and Jin Wang It is certified that error appears in the above-identified patent and that said Letters Patent is hereby corrected as shown below:

Column 11,
Line 19, insert a period -- . -- after "block 1010".

Column 13,
Line 44, replace "paid" with -- said --.

Column 14,
Line 4, replace "said electrical data" with -- said electrical data, --.
Line 27, replace "adjusting at last" with -- adjusting at least --.

Signed and Sealed this

Twenty-sixth Day of April, 2005

JON W. DUDAS
*Director of the United States Patent and Trademark Office*